United States Patent
Huang et al.

(10) Patent No.: US 12,313,718 B2
(45) Date of Patent: May 27, 2025

(54) TARGET MOTION SIGNAL ACQUISITION

(71) Applicant: Siemens Shenzhen Magnetic Resonance Ltd., Shenzhen (CN)

(72) Inventors: Yan Tu Huang, Shenzhen (CN); Peter Speier, Erlangen (DE)

(73) Assignee: Siemens Healthineers AG, Erlangen (DE)

( * ) Notice: Subject to any disclaimer, the term of this patent is extended or adjusted under 35 U.S.C. 154(b) by 206 days.

(21) Appl. No.: 18/102,846

(22) Filed: Jan. 30, 2023

(65) Prior Publication Data

US 2023/0243911 A1   Aug. 3, 2023

(30) Foreign Application Priority Data

Jan. 30, 2022 (CN) .......................... 202210113947.8

(51) Int. Cl.
  G01V 3/00 (2006.01)
  G01R 33/56 (2006.01)
  G01R 33/565 (2006.01)

(52) U.S. Cl.
  CPC ... G01R 33/56509 (2013.01); G01R 33/5608 (2013.01)

(58) Field of Classification Search
  CPC ............ G01R 33/4826; G01R 33/5618; G01R 33/56341
  (Continued)

(56) References Cited

U.S. PATENT DOCUMENTS

| | | | |
|---|---|---|---|
| 2015/0331075 A1* | 11/2015 | Yamamoto | G01R 33/288 324/309 |
| 2021/0052187 A1 | 2/2021 | He et al. | |
| 2021/0378603 A1 | 12/2021 | He et al. | |

FOREIGN PATENT DOCUMENTS

| | | |
|---|---|---|
| CN | 112415452 A | 2/2021 |
| CN | 112415453 A | 2/2021 |

OTHER PUBLICATIONS

Kim, Daeun et al: "Region-optimized virtual (ROVir) coils: Localization and/or suppression of spatial regions using sensor-domain beamforming"; Magnetic Resonance in Medicine; Year: 2021, vol. 86, No. 1, pp. 197-212.

* cited by examiner

*Primary Examiner* — Walter L Lindsay, Jr.
*Assistant Examiner* — Frederick Wenderoth
(74) *Attorney, Agent, or Firm* — Banner & Witcoff Ltd.

(57) ABSTRACT

Method acquiring a target physiological motion signal, including: acquiring multi-channel complex signals received by multiple channels; and acquiring, from the multi-channel complex signals using a motion signal synthesis vector corresponding to a target motion signal, a target motion complex signal with interference removed; acquiring data received by multiple channels, the data including data without external interference in a first sub-period and data with external interference in a second sub-period; acquiring an external interference suppression matrix based on the data, and acquiring external interference suppression data based on the data without external interference or the data with external interference and the external interference suppression matrix; acquiring a motion signal correlation matrix of the target motion signal in frequency domain based on a frequency range of the target motion signal; and using, as a motion signal synthesis vector, an eigenvector acquired according to an eigenvalue of the motion signal correlation matrix.

12 Claims, 6 Drawing Sheets

100

S110
Acquire multi-channel complex signals received by multiple channels, where each of the multi-channel complex signals is a signal received after a high-frequency signal is modulated by at least one target motion signal of a scanned object in magnetic resonance scanning.

S120
Acquire, from the multi-channel complex signals by using a motion signal synthesis vector corresponding to at least one target motion signal, at least one target motion complex signal with interference removed.

(58) Field of Classification Search
USPC .......................................................... 324/309
See application file for complete search history.

FIG 1

S110
Acquire multi-channel complex signals received by multiple channels, where each of the multi-channel complex signals is a signal received after a high-frequency signal is modulated by at least one target motion signal of a scanned object in magnetic resonance scanning.

S120
Acquire, from the multi-channel complex signals by using a motion signal synthesis vector corresponding to at least one target motion signal, at least one target motion complex signal with interference removed.

FIG 2

S210
Acquire data received by multiple channels within a specified period 0 to t2, where the data received by the multiple channels within the specified period 0 to t2 includes data T1 without external interference within a first specified sub-period 0 to t1 and data T2 with external interference in a second specified sub-period t1 to t2.

S220
Acquire an external interference suppression matrix based on the data T1 without external interference in the first specified sub-period and the data T2 with external interference in the second specified sub-period, and acquire external interference suppression data based on the data T1 without external interference or the data T2 with external interference and the external interference suppression matrix.

S230
Acquire a motion signal correlation matrix of the at least one target motion signal in frequency domain based on the external interference suppression data and a frequency of the at least one target motion signal.

S240
Use, as the motion signal synthesis vector, an eigenvector acquired according to an eigenvalue of the motion signal correlation matrix.

FIG 3

S310
For the target motion signal, acquire data received by multiple channels within a specified period 0 to t2, where the data T received by the multiple channels within the specified period 0 to t2 includes data T1 without external interference within a first specified sub-period 0 to t1 and data T2 with external interference in a second specified sub-period t1 to t2, and T1 and T2 are used as training data for two stages.

S320
For the data received by the multiple channels within the specified period, estimate data without external interference in the second specified sub-period by using the data without external interference in the first specified sub-period, and use an increment of the data T2 with external interference in the second specified sub-period t1 to t2 relative to the estimated data without external interference in the second specified sub-period as correction data R, that is, the estimated data without external interference in the second specified sub-period is subtracted from the data with external interference in the second specified sub-period, to acquire the correction data R1, where the correction data constitutes a correction matrix.

S330
Decompose the correction matrix into eigenvalues and eigenvectors, and remove an eigenvector whose energy accounts for more than a specified threshold in total energy of all eigenvectors, or remove an eigenvector with the largest energy, to generate the external interference suppression matrix.

S610
Acquire a frequency correlation matrix W of the at least one target motion signal based on the frequency range of the at least one target motion signal and a number of data samples within the specified period.

S620
Acquire signal strength of at least one target motion in frequency domain based on the frequency correlation matrix of the at least one target motion signal and the external interference suppression data $T1_{rf}$ in at least one specified period.

S630
Calculate the correlation matrix of the at least one target motion signal based on the signal strength of the at least one target motion in frequency domain.

S640
Decompose the correlation matrix of the first target motion signal into eigenvalues and eigenvectors, and remove an eigenvector whose energy accounts for more than a specified threshold in total energy of all eigenvectors, or remove an eigenvector with the largest energy, to generate a first target motion suppression matrix.

S650
Acquire external interference and first object motion interference suppression data based on the external interference suppression data and the first target motion suppression matrix.

S660
Acquire a second target motion correlation matrix based on the frequency correlation matrix of the second target motion signal and the external interference and first object motion interference suppression data, where the frequency correlation matrix of the second target motion signal is acquired in the manner corresponding to step S510.

TARGET MOTION SIGNAL ACQUISITION

TECHNICAL FIELD

The disclosure relates to the field of magnetic resonance technologies, and in particular, to a method and an apparatus for acquiring at least one target motion signal and a pilot tone device, a non-transitory computer-readable storage medium storing a computer program, and a computer program product.

BACKGROUND

Magnetic resonance imaging (MRI) is a technique that uses magnetic resonance phenomena for imaging. The principle of magnetic resonance imaging mainly comprises: Nuclei containing an odd number of protons, for example, hydrogen nuclei widely existing in a human body, the protons thereof are in a spin motion, like small magnets, and the small magnets have irregular axes of spin. If an external magnetic field is applied, the small magnets will be rearranged according to magnetic lines of force of the external magnetic field, and are specifically arranged in two directions, i.e., directions parallel to and anti-parallel to the magnetic lines of force of the external magnetic field. The direction parallel to the magnetic lines of force of the external magnetic field mentioned above is referred to as a positive longitudinal axis, and the direction anti-parallel to the magnetic lines of force of the external magnetic field mentioned above is referred to as a negative longitudinal axis. The nuclei only have a longitudinal magnetization component that has both a direction and an amplitude. Nuclei in the external magnetic field are excited by radio frequency (RF) pulses at a specific frequency such that the axes of spin of the nuclei deviate from the positive longitudinal axis or the negative longitudinal axis so as to produce resonance, which is the magnetic resonance phenomenon. After the axes of spin of the excited nuclei mentioned above deviate from the positive longitudinal axis or the negative longitudinal axis, the nuclei have a transverse magnetization component.

After the radio frequency pulses stop being transmitted, the excited nuclei transmit echo signals and gradually release the absorbed energy in the form of electromagnetic waves. Both the phase and energy level thereof are restored to the state before being excited, and the echo signals transmitted by the nuclei are subjected to further processing such as space encoding such that the image can be reconstructed.

Depending on a radio frequency pulse sequence, also called a sequence, image acquisition in magnetic resonance tomography takes from a few milliseconds to a few seconds. Generally, a longer acquisition time indicates smaller noise artifacts. Therefore, correspondingly, image acquisition starts at the beginning of a phase in which the body remains relatively immobile, to avoid motion artifacts caused by motion during image acquisition. However, there are still unavoidable motions, such as respiration and heartbeat. In this case, a phase of motion, for example, expiration or contraction of the cardiac muscle, is followed by a phase of relative inactivity. Image acquisition in this phase has a relatively long time and little motion is expected, so that the best measurement result can be expected herein.

SUMMARY

According to one aspect of the disclosure, a method for acquiring a target motion signal is proposed, including: acquiring multi-channel complex signals received by multiple channels, where each of the multi-channel complex signals is a signal received after a high-frequency signal is modulated by at least one target motion signal of a scanned object in magnetic resonance scanning; and acquiring, from the multi-channel complex signals by using a motion signal synthesis vector corresponding to at least one target motion signal, at least one target motion complex signal with interference removed; where the motion signal synthesis vector corresponding to the at least one target motion signal is acquired in the following manner: acquiring data received by multiple channels within a specified period, where the data received by the multiple channels within the specified period includes data without external interference in a first specified sub-period and data with external interference in a second specified sub-period; acquiring an external interference suppression matrix based on the data without external interference in the first specified sub-period and the data with external interference in the second specified sub-period, and acquiring external interference suppression data based on the data without external interference or the data with external interference and the external interference suppression matrix; acquiring a motion signal correlation matrix of the at least one target motion signal in frequency domain based on the external interference suppression data and a frequency range of the at least one target motion signal; and using, as the motion signal synthesis vector, an eigenvector acquired according to an eigenvalue of the motion signal correlation matrix.

According to another aspect of the disclosure, an apparatus for acquiring at least one target motion signal is proposed, including: a first unit, configured to acquire multi-channel complex signals received by multiple channels, where each of the multi-channel complex signals is a signal received after a high-frequency signal is modulated by at least one target motion signal of a scanned object in magnetic resonance scanning; and a second unit, configured to acquire, from the multi-channel complex signals by using a motion signal synthesis vector corresponding to at least one target motion signal, at least one target motion complex signal with interference removed. The second unit includes: a first subunit, configured to acquire data received by multiple channels within a specified period, where the data received by the multiple channels within the specified period includes data without external interference in a first specified sub-period and data with external interference in a second specified sub-period; a second subunit, configured to acquire an external interference suppression matrix based on the data without external interference in the first specified sub-period of the at least one period and the data with external interference in the second specified sub-period, and acquire external interference suppression data based on the data without external interference or the data with external interference and the external interference suppression matrix; a third subunit, configured to acquire a motion signal correlation matrix of the at least one target motion signal in frequency domain based on the external interference suppression data and a frequency of the at least one target motion signal; and a fourth subunit, configured to use, as the motion signal synthesis vector, an eigenvector acquired according to an eigenvalue of the motion signal correlation matrix.

According to another aspect of the disclosure, a pilot tone device is proposed, including: a transmitter, configured to transmit a high-frequency signal, where the high-frequency signal is a radio frequency signal outside a band of a magnetic resonance radio frequency signal; a multi-channel receiver, configured to receive a high-frequency signal modulated by a first target motion signal and a second target motion signal of a scanned object in magnetic resonance scanning; and an electronic device. The electronic device includes: at least one processor; and a memory communicatively coupled to the at least one processor; where the memory stores a computer program, and when executed by the at least one processor, the computer program realizes the method described above.

According to another aspect of the disclosure, a non-transitory computer-readable storage medium storing a computer program is proposed, where when executed by a processor, the computer program realizes the method described above.

According to another aspect of the disclosure, a computer program product is proposed, including a computer program, where when executed by a processor, the computer program realizes the method described above.

BRIEF DESCRIPTION OF THE DRAWINGS

The above and other features and advantages of the present invention will become more apparent to those of ordinary skill in the art from the detailed description of the embodiments of the disclosure with reference to the accompanying drawings. In the accompanying drawings.

DETAILED DESCRIPTION

For a clearer understanding of the technical features, objectives, and effects of the disclosure, the specific embodiments of the disclosure will now be described with reference to the accompanying drawings, where the same reference numerals represent the same parts.

The word "exemplary" represents "serving as an instance, example, or description" herein, and any illustration and implementation described as "exemplary" herein should not be interpreted as a more preferred or more advantageous technical solution.

For clarity of the drawings, only the relevant parts of the disclosure are schematically shown throughout the drawings, and they do not represent the actual structure of a product. In addition, in order to make the drawings concise and easy to understand, in some drawings, only one of the components having the same structure or function is schematically shown or only one of them is marked.

Herein, "a/an" means not only "only one", but also "more than one". Herein, "first", "second", etc. are only used to distinguish one from another, and do not indicate their importance and order, the premise for mutual existence, etc.

In a process of magnetic resonance imaging, to acquire clear clinical diagnostic images, it is required that a scanned object must remain still in a scanning process, especially for some motion-sensitive sequences. However, obviously, some motions of the scanned object are unavoidable, such as physiological motions caused by respiration, heartbeat, etc. To minimize the impact of motions, various methods are used to detect these motions, such as a respiration zone, electrocardiogram (ECG), prospective acquisition correction (PACE), etc. By capturing these motions, magnetic resonance imaging sequences and signal acquisitions can be triggered or gated at times of minimal motions, such as plateau periods of patient inspiration or expiration. These methods require additional operations and are complicated to operate. Moreover, another sensing device needs to be placed on the scanned object, which is not a good experience for the scanned object.

Another method for detecting the motions is to use a pilot tone device that can be integrated into a local coil. The pilot tone device includes a transmitting antenna through which a high-frequency signal is transmitted. The high-frequency signal is, for example, a radio frequency signal outside an MRI band. After the high-frequency signal interacts with the scanned object through attenuation, reflection, and/or interference, the high-frequency signal is received by the local coil to acquire a pilot tone signal. An amplitude/a phase of the received pilot tone signal varies with the physiological motion of the scanned object. By analyzing the received pilot tone signal, a motion signal of the scanned object can be acquired. The pilot tone device can be integrated in the local coil, so that the operation of the local coil, such as fastening and positioning, can be performed like a normal coil without additional operations, which is simple and easy for an operator. In addition, no burden is increased for a scanned object due to a sensor disposed inside or on the skin.

When multiple signal channels are provided (for example, multiple local coils), multi-channel signals can be acquired from multiple channels. However, generally, only high-quality single-channel signals representing physiological motions (such as a respiration motion or a heartbeat motion) are required.

Figure 1:
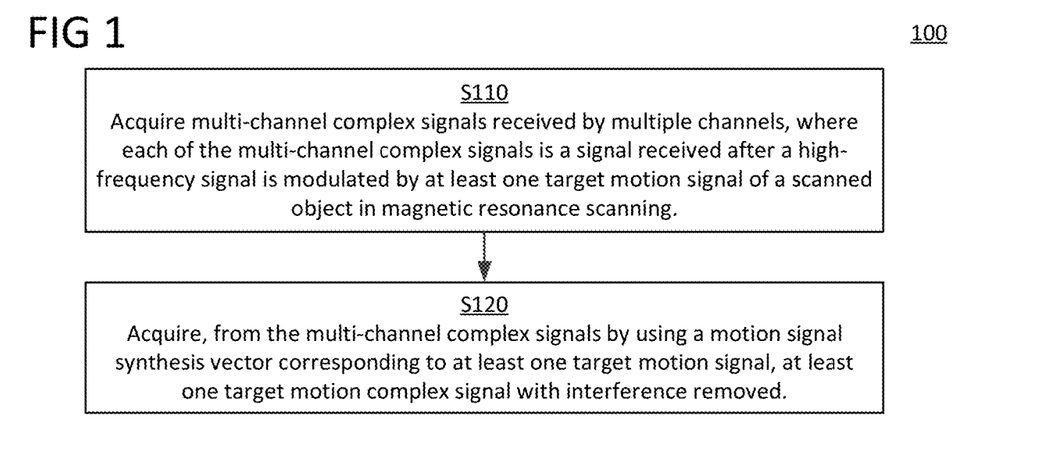
FIG. 1 is a flowchart of a method for acquiring at least one target motion signal according to some embodiments of the disclosure.

According to an embodiment of the disclosure, a method 100 for acquiring at least one target motion signal is proposed. Referring to FIG. 1, the method 100 includes:

Step S110: Acquire multi-channel complex signals received by multiple channels, where each of the multi-channel complex signals is a signal received after a high-frequency signal is modulated by at least one target motion signal of a scanned object in magnetic resonance scanning.

Step S120: Acquire, from the multi-channel complex signals by using a motion signal synthesis vector corresponding to at least one target motion signal, at least one target motion complex signal with interference removed.

A multi-channel complex signal can be represented by a vector d(t), where d(t) is a matrix of $1 \times N_T$, and $N_T$ is a number of multiple channels. In some embodiments, the signals received by the multiple channels are digitized data d(t), and may be directly received digitized data d(t) or may be digitized data d(t) acquired after analog-to-digital conversion of received analog data. The signals received by the multiple channels may be digitized data d(t) without preprocessing or digitized data d(t) after preprocessing.

In some embodiments, the high-frequency signal is transmitted by the transmitting antenna of the pilot tone device integrated into the local coil. The high-frequency signal is, for example, a radio frequency signal outside an MRI band. During scanning of the scanned object, the high-frequency signal emitted by the pilot tone device is modulated by at least one target motion signal of the scanned object, and then received by multiple local coils to acquire a pilot tone signal. In some examples, the pilot tone signal can be directly used as a multi-channel complex signal. In some other examples, the multi-channel complex signal may be a pre-processed pilot tone signal, such as a pilot tone signal centered at an average value of 0.

The target motion signal is, for example, a motion signal used for scanning and navigation, such as a respiration signal or a heartbeat signal. A signal, that is, an interference signal, that distorts the target motion signal may be an external interference signal of the scanned object, such as a radio frequency signal, or other unavoidable motion signals of the scanned object. The received multi-channel signals may include a wanted signal and one or more unwanted signals, where the wanted signal is a target motion signal, for example, a motion signal used for scanning and navigation. The unwanted signal is an interference signal. In scanning of a human body, there are respiration and heartbeat motions. If the target motion signal is a respiration signal, a heartbeat signal and an MRI radio frequency signal are interference signals. If the target motion signal is a heartbeat signal, a respiration signal and an MRI radio frequency signal are interference signals.

In step S120, the motion signal synthesis vector corresponding to the at least one target motion signal can maximize the wanted target motion signal as much as possible, and at the same time minimize as much as possible other signals such as radio frequency signals and other unavoidable signals of the scanned object that interfere with the target motion signal.

Figure 2:
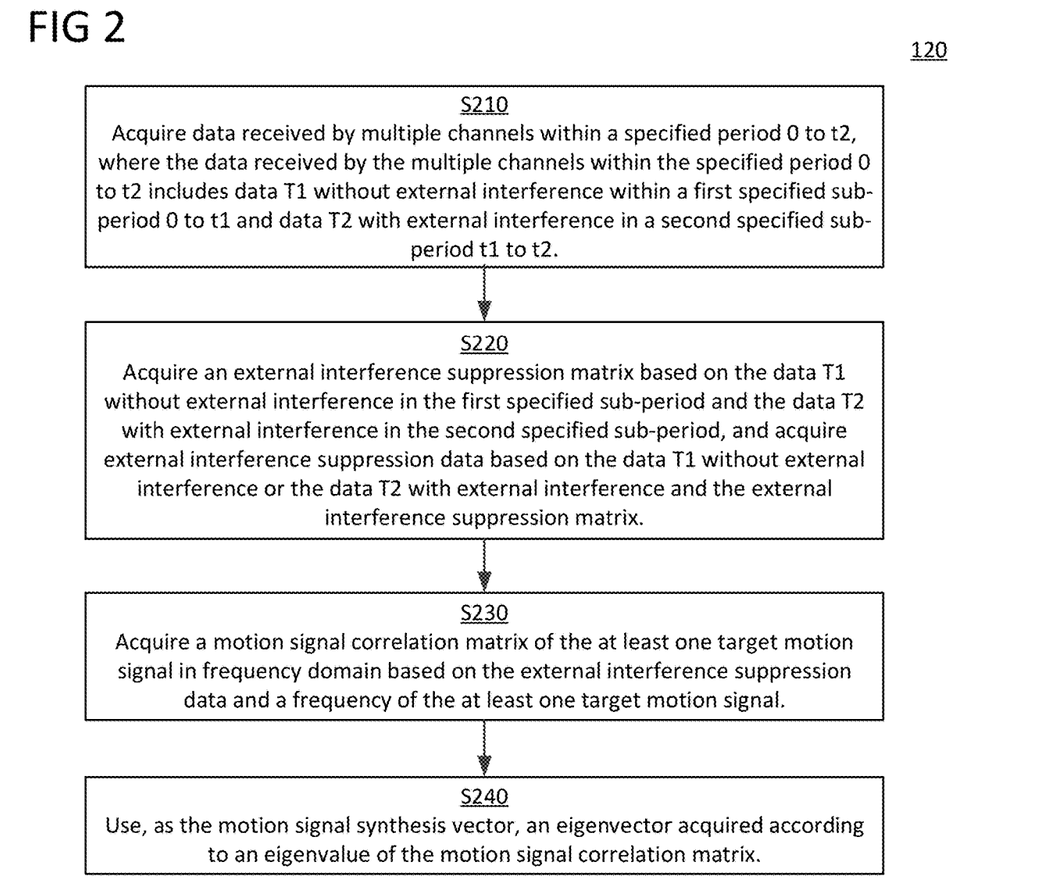
FIG. 2 is a flowchart of acquiring a motion signal synthesis vector corresponding to at least one target motion signal in a method for acquiring at least one target motion signal according to some embodiments of the disclosure.

Referring to FIG. 2, in step S120, the motion signal synthesis vector corresponding to the at least one target motion signal is acquired in the following manner:

Step S210: Acquire data received by multiple channels within a specified period 0 to t2, where the data received by the multiple channels within the specified period 0 to t2 includes data T1 without external interference within a first specified sub-period 0 to t1 and data T2 with external interference in a second specified sub-period t1 to t2.

Step S220: Acquire an external interference suppression matrix based on the data T1 without external interference in the first specified sub-period and the data T2 with external interference in the second specified sub-period, and acquire external interference suppression data based on the data T1 without external interference or the data T2 with external interference and the external interference suppression matrix.

Step S230: Acquire a motion signal correlation matrix of the at least one target motion signal in frequency domain based on the external interference suppression data and a frequency of the at least one target motion signal.

Step S240: Use, as the motion signal synthesis vector, an eigenvector acquired according to an eigenvalue of the motion signal correlation matrix.

Through the above method, a high-quality single-channel complex signal that can represent at least one target motion can be acquired from the multi-channel complex signal. Preferably, an eigenvector corresponding to a maximum eigenvalue of the motion signal correlation matrix is used as the motion signal synthesis vector.

Figure 3:
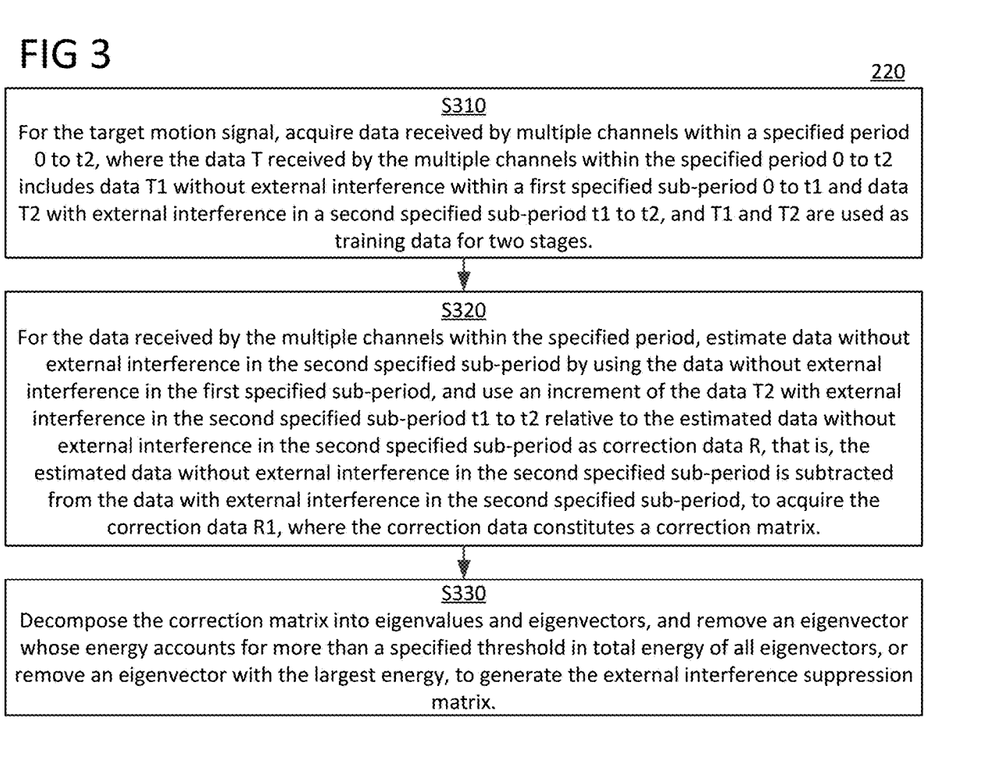
FIG. 3 is a flowchart for acquiring an external interference suppression matrix in a method for acquiring at least one target motion signal according to some embodiments of the disclosure.

In step S220, referring to FIG. 3, the external interference suppression matrix may be acquired in the following manner.

Step S310: For the target motion signal, acquire data received by multiple channels within a specified period 0 to t2, where the data T received by the multiple channels within the specified period 0 to t2 includes data T1 without external interference within a first specified sub-period 0 to t1 and data T2 with external interference in a second specified sub-period t1 to t2, and T1 and T2 are used as training data for two stages.

As mentioned above, a signal, that is, an interference signal that distorts the motion signal may be an MRI radio frequency signal. The pilot tone signal may be distorted by MRI radio frequency pulses used for imaging. This is because when MRI radio frequency pulses are applied, the local coil is exposed in a strong radio frequency field, high radio frequency energy is coupled to an input end of a low noise amplifier LNA or a low noise converter LNC, and the high radio frequency energy increases a temperature of an electronic device, causing a gain change in a receive channel and affecting a phase and an amplitude of the received pilot tone signal. Therefore, to acquire useful physiological motion signals, the radio frequency interference needs to be eliminated. If the interference signal is an MRI radio frequency signal, the data without interference is data without radio frequency interference, the data with interference is data with radio frequency interference, and the external interference suppression matrix is a radio frequency interference suppression matrix. Correspondingly, the data received by the multiple channels within the specified period can be: the data T1 without external interference in the first specified sub-period 0 to t1 before a correction pulse sequence runs and the data T2 with external interference in the second specified sub-period t1 to t2 when the pulse sequence runs, where the correction pulse sequence and a radio frequency pulse sequence for MRI imaging are the same or substantially the same.

Figure 4:
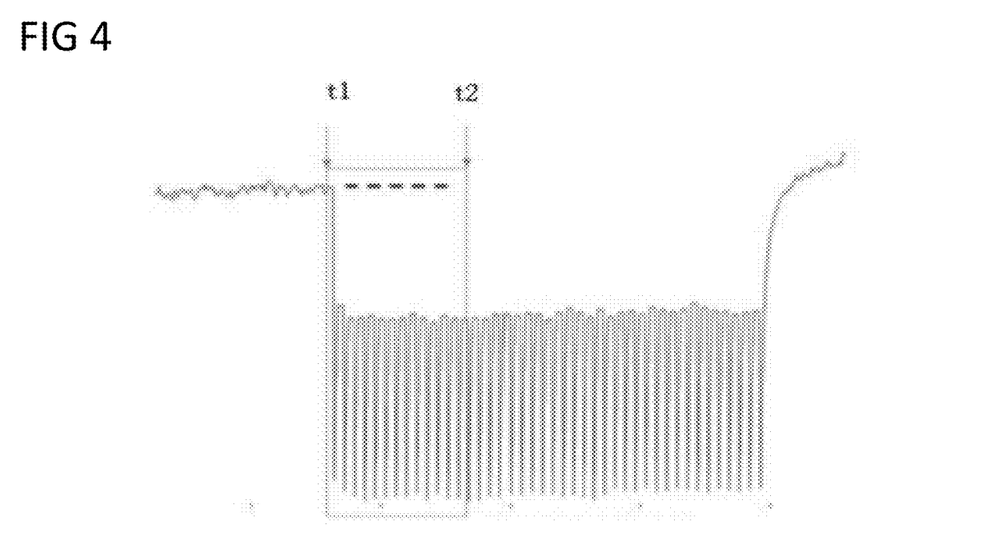
FIG. 4 is a schematic pilot tone signal received by a channel.

In some embodiments, the data received by the multiple channels within the specified period in step S310 may be relatively stable data. For example, the specified period may be a period in which the periodic variation of the target motion signal is small. For physiological motions such as respiration and heartbeat, a phase of motion, such as expiration or contraction of the cardiac muscle, is followed by a phase of relative inactivity in which signal acquisition has a relatively long period and periodic variation of the expected physiological motion is small, so that a better measurement result can be expected. Exemplarily, a pilot tone signal received by a channel during a pulse sequence is shown in FIG. 4. Before the moment t1, no correction pulse sequence is applied, and acquired data is data T1 without external interference. t2 is a moment spaced from t1 by a very short interval, and a change of the target motion is small between the moments t1 and t2. Data acquired between t1 to t2 is the data T2 with external interference.

Step S320: For the data received by the multiple channels within the specified period, estimate data without external interference in the second specified sub-period by using the data without external interference in the first specified sub-period, and use an increment of the data T2 with external interference in the second specified sub-period t1 to t2 relative to the estimated data without external interference in the second specified sub-period as correction data R, that is, the estimated data without external interference in the second specified sub-period is subtracted from the data with external interference in the second specified sub-period, to acquire the correction data R1, where the correction data constitutes a correction matrix.

In step S320, to acquire the correction data R1 (pure data with external interference), the data without external interference in the second specified sub-period may be estimated by using the data without external interference in the first specified sub-period. For example, an average value can be calculated for the data without external interference in the first specified sub-period, and the calculated average value data is used as the estimated data without external interference in the second specified sub-period, shown by a dashed line in FIG. 4. Alternatively, polynomial curve fitting is performed on the data without external interference in the first specified sub-period, and the estimated data without external interference in the second specified sub-period is acquired according to an acquired fitting curve.

If data is received within multiple specified periods, average value processing is performed on the correction data in the multiple specified periods, to acquire average correction data R, and the average correction data R constitutes a correction matrix.

Step S330: Decompose the correction matrix into eigenvalues and eigenvectors, and remove an eigenvector whose energy accounts for more than a specified threshold in total energy of all eigenvectors, or remove an eigenvector with the largest energy, to generate the external interference suppression matrix.

In step S330, based on the correction data R, the eigenvector matrix of $R^H \times R$ is acquired by the following formula, where $R^H$ is complex conjugate transpose of R. The correction data is decomposed into eigenvalues and eigenvectors, and an eigenvector whose energy accounts for more than a specified threshold in total energy of all eigenvectors is removed, or an eigenvector with the largest energy is removed, to generate the external interference suppression matrix. For example, for the correction data R, it can be assumed that eigenvalues are in ascending order, $N_T$ represents a number of channels of the correction data R or a number of columns of the matrix, and the first $N_{T-b}$ columns of the eigenvector matrix are used as the external interference suppression matrix, where b is usually 1 or 2, that is, the first or second component with the largest external interference suppression. In this way, based on the data received by the multiple channels in one or more specified periods, the data T1 without interference in the first specified sub-period 0 to t1 of each specified period and the data T2 with interference in the second specified sub-period t1 to t2 are used to acquire an external interference suppression matrix.

In some embodiments, radio frequency interference is used as an example, and for the eigenvector matrix $V_{rf}$, processing corresponding to the following formula is performed to acquire an external interference suppression matrix.

$$M_{rf} = V_{rf} \times O \times V_{rf}^{-1} \quad (1)$$

$V_{rf}^{-1}$ is an inverse matrix of $V_{rf}$, and O is a matrix acquired after one or more row or column elements corresponding to eigenvectors whose energy accounts for more than a specified threshold in the total energy of all eigenvectors in the eigenvector matrix $V_{rf}$ are replaced with 0 in an identity matrix I. For example, assuming that a ratio of the energy of the last column of eigenvector in the eigenvector matrix $V_{rf}$ in the total energy of all eigenvectors reaches a specified threshold, such as 90%, it can be first set that O=I, and then it is set that O is O(n, n)=0, that is, it is assumed that the eigenvalues are in ascending order, and the last row and the last column in the identity matrix are set to 0 to acquire a O matrix. Alternatively, O is a matrix acquired after replacing a row or a column element corresponding to an eigenvector with the largest energy with 0. Then, after $V_{rf}*O$, it is equivalent to replacing the eigenvector with the largest energy in $V_{rf}$ with 0, to remove the eigenvector with the largest energy in $V_{rf}$.

As mentioned above, external interference suppression data is estimated according to the external interference suppression matrix $M_{rf}$ based on the data without external interference in the first specified sub-period or the data with external interference in the second specified sub-period.

$$T1_{rf} = T1 \times M_{rf} \quad (2)$$

$M_{rf}$ is the external interference suppression matrix, and T1 is the data without external interference in the first specified sub-period 0 to t1.

When only T2 is available, the following formula (3) can also be used to calculate the external interference suppression data:

$$T1_{rf} = T2 \times M_{rf} \quad (3)$$

$M_{rf}$ is the external interference suppression matrix, and T2 is the data without external interference in the second specified sub-period t1 to t2.

The motion signal correlation matrix C can be calculated based on the external interference suppression data $T1_{rf}$. In some embodiments, referring to FIG. 5, in step S230, the correlation matrix of at least one target motion signal may be calculated in the following manner.

Figure 5:
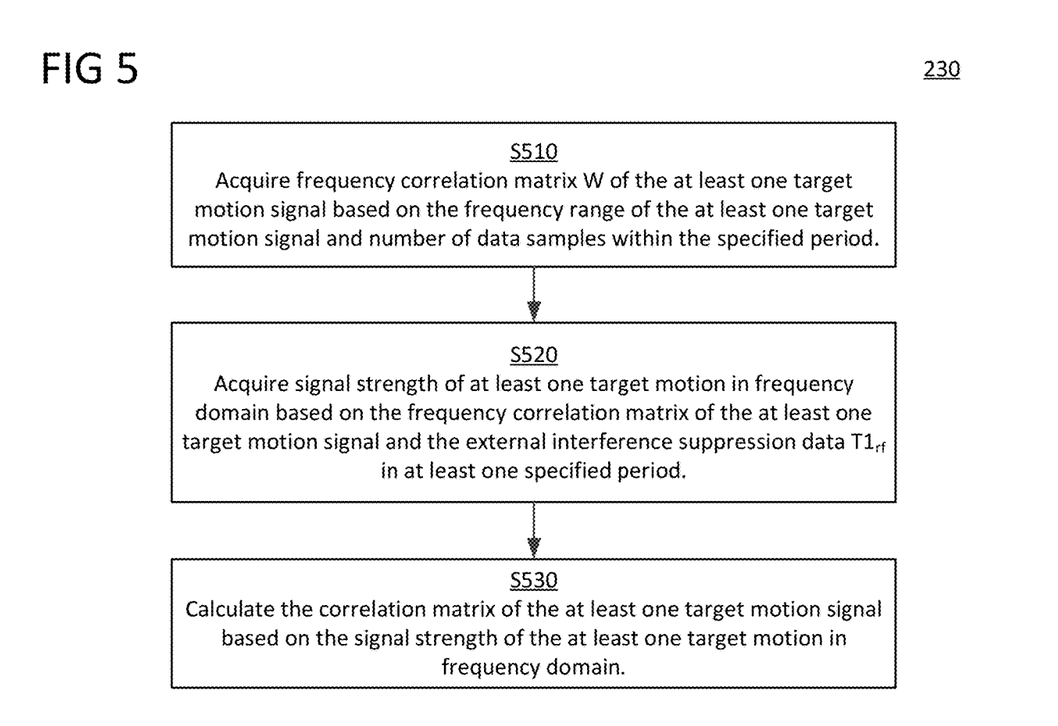
FIG. 5 is a flowchart for acquiring a correlation matrix of at least one target motion signal in a method for acquiring at least one target motion signal according to some embodiments of the disclosure.

Step S510: Acquire a frequency correlation matrix W of the at least one target motion signal based on the frequency range of the at least one target motion signal and a number of data samples within the specified period.

The frequency correlation matrix W is a matrix of a J*K size, K is a number of data samples in at least one specified period, and J can be a number of matrix rows selected according to empirical values. Each row of the frequency correlation matrix is a complex exponential signal of a frequency, that is, $$W(j, k) = e^{-\frac{2jk\pi}{N}},$$

where N is a number of samples per second. Frequencies of rows may be linearly spaced from each other from a lower frequency limit to an upper frequency limit of the target motion signal. For example, in the case of a heartbeat signal, a frequency variation range is usually 0.7 Hz to 2 Hz, and in the case of a respiration signal, a frequency variation range is usually 0.1 Hz to 0.6 Hz. If J=6, the frequency of the row corresponds to [0.1 Hz, 0.2 Hz, 0.3 Hz, 0.4 Hz, 0.5 Hz, 0.6 Hz] for a respiration motion.

Step S520: Acquire signal strength of at least one target motion in frequency domain based on the frequency correlation matrix of the at least one target motion signal and the external interference suppression data $T1_{rf}$ in at least one specified period.

Step S530: Calculate the correlation matrix of the at least one target motion signal based on the signal strength of the at least one target motion in frequency domain.

Figure 6:
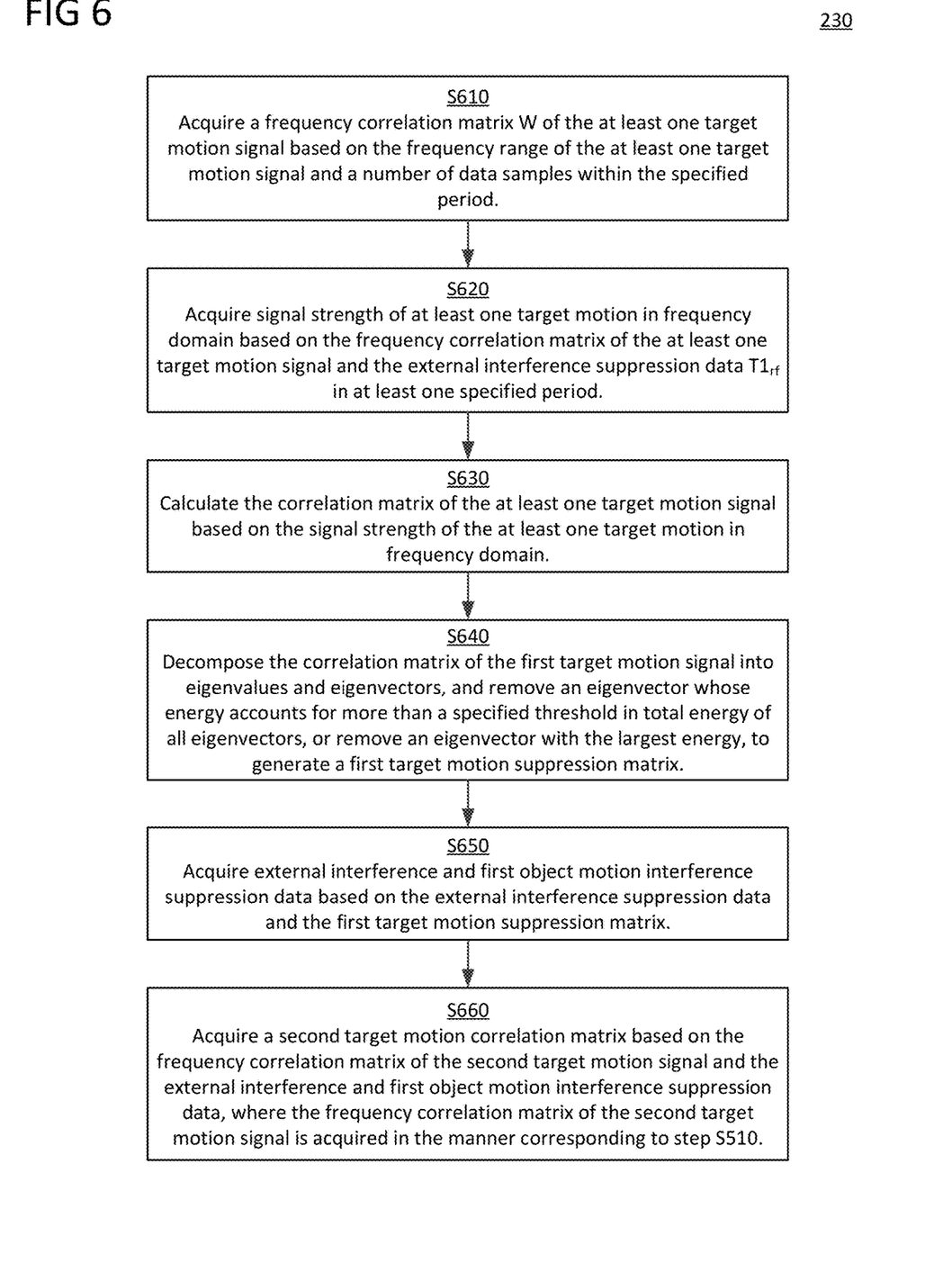
FIG. 6 is a flowchart for acquiring a correlation matrix of a first target motion signal and a correlation matrix of a second target motion signal in a method for acquiring at least one target motion signal according to some embodiments of the disclosure.

If there are multiple target motion signals, for example, at least one target motion signal includes a first target motion signal and a second target motion signal, referring to FIG. 6, a correlation matrix of the first target motion signal and a correlation matrix of the second target motion signal are respectively acquired in the following manners.

Steps S610 to S630 correspond to steps S510 to S530, and are used to acquire the correlation matrix of the first target motion signal.

Step S640: Decompose the correlation matrix of the first target motion signal into eigenvalues and eigenvectors, and remove an eigenvector whose energy accounts for more than a specified threshold in total energy of all eigenvectors, or remove an eigenvector with the largest energy, to generate a first target motion suppression matrix.

Step S650: Acquire external interference and first object motion interference suppression data based on the external interference suppression data and the first target motion suppression matrix.

Step S660: Acquire a second target motion correlation matrix based on the frequency correlation matrix of the second target motion signal and the external interference and first object motion interference suppression data, where the frequency correlation matrix of the second target motion signal is acquired in the manner corresponding to step S510.

Scanning a human body is used as an example, and there are both respiration and heartbeat motions. For the respiration motion, a correlation matrix of the respiration motion can be acquired by the following formulas (4-1) and (4-2):

$$F_r = W_r \times T1_{rf} \quad (4\text{-}1)$$

$F_r$ is signal strength of the respiration motion in frequency domain, $W_r$ is the frequency correlation matrix of the respiration motion, and $T1_{rf}$ is the external interference suppression data.

$$C_r = F_r^H \times F_r \quad (4\text{-}2)$$

$C_r$ is a correlation matrix of the respiration motion.

The respiration signal and the heartbeat signal are mixed together. Therefore, the respiration signal can be regarded as interference to the heartbeat signal. Before the correlation matrix of the heartbeat motion is calculated, the interference of the respiration signal on the heartbeat signal can be removed first. The respiration correlation matrix is decomposed into eigenvalues and eigenvectors, and an eigenvector whose energy accounts for more than a specified threshold in total energy of all eigenvectors is removed, or an eigenvector with the largest energy is removed, to generate a respiration suppression matrix, that is, a matrix that suppresses or corrects respiration interference. Specifically, $V_r$ is an eigenvector of the correlation matrix of the respiration motion, and the eigenvalues are set in ascending orders, $N_{rf}$ is a number of channels of $T1_{rf}$ or a number of columns of the matrix, and the first $N_{rf\text{-}b}$ columns of $V_r$ are used as the respiration depression matrix $M_r$, where b is usually 1 or 2, that is, the first or second component with the largest respiration signal suppression.

For the heartbeat motion, the correlation matrix of the heartbeat motion can be acquired by the following formulas (5-1) to (5-3):

$$T1_r = T1_{rf} \times M_r \quad (5\text{-}1)$$

$M_r$ is the respiration suppression matrix, and $T1_r$ is respiration signal interference suppression data on the basis of the external interference suppression data.

$$F_c = W_c \times T1_r \quad (5\text{-}2)$$

$F_c$ is signal strength of the heartbeat motion in frequency domain, $W_c$ is the frequency correlation matrix of the heartbeat motion, and $T1_{rf}$ is the external interference suppression data.

$$C_c = F_c^H \times F_c \quad (5\text{-}3)$$

$C_c$ is the correlation matrix of the heartbeat motion.

As mentioned above, in step S240, an eigenvector corresponding to a maximum eigenvalue of the motion signal correlation matrix is used as the motion signal synthesis vector. For respiration and heartbeat signals, the respiration signal synthesis vector $v_r$ is an eigenvector corresponding to a maximum eigenvalue of the respiration motion correlation matrix $C_r$, and the heartbeat signal synthesis vector $v_c$ is an eigenvector corresponding to a maximum eigenvalue of the heartbeat motion correlation matrix $C_c$.

As mentioned above, in step S120, at least one target motion complex signal with interference removed is acquired from the multi-channel complex signals by using a motion signal synthesis vector corresponding to at least one target motion signal. For the respiration motion, $d(t) \times v_r$ maximizes the respiration signal and minimizes external interference (such as radio frequency interference). For the heartbeat motion, $d(t) \times v_c$ maximizes the heartbeat signal and minimizes external interference (such as radio frequency interference) and respiration signal interference. In this way, a single-channel respiration motion complex signal and a single-channel respiration motion complex signal can be acquired.

The inventors find that complex signals are not suitable for every application. In many applications, such as display and triggering applications, real signals are required. To this end, in some embodiments, the method 100 further includes: rotating a maximum variance direction of at least one target motion complex signal, for example, a maximum variance direction of a respiration motion complex signal acquired through $d(t) \times v_r$ or a heartbeat motion complex signal acquired through $d(t) \times v_c$, to a signal real axis, and taking a real part of the rotated at least one target motion complex signal. In the maximum variance direction of a signal, the noise is the smallest, so that a high-quality real signal of at least one target motion can be acquired through the above rotation. The maximum variance direction is acquired by acquiring principal components of a real part and an imaginary part of at least one target motion complex signal.

Figure 7A:
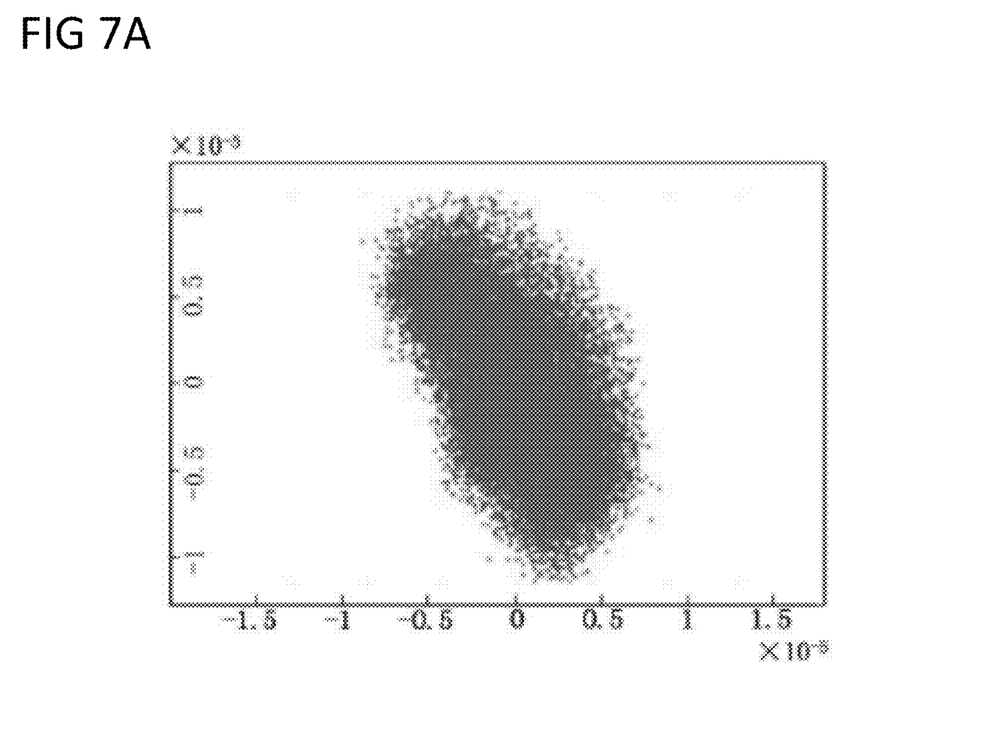
FIG. 7A and FIG. 7B respectively show a signal before rotation and a signal after rotation according to some embodiments of the disclosure.
Figure 7B:
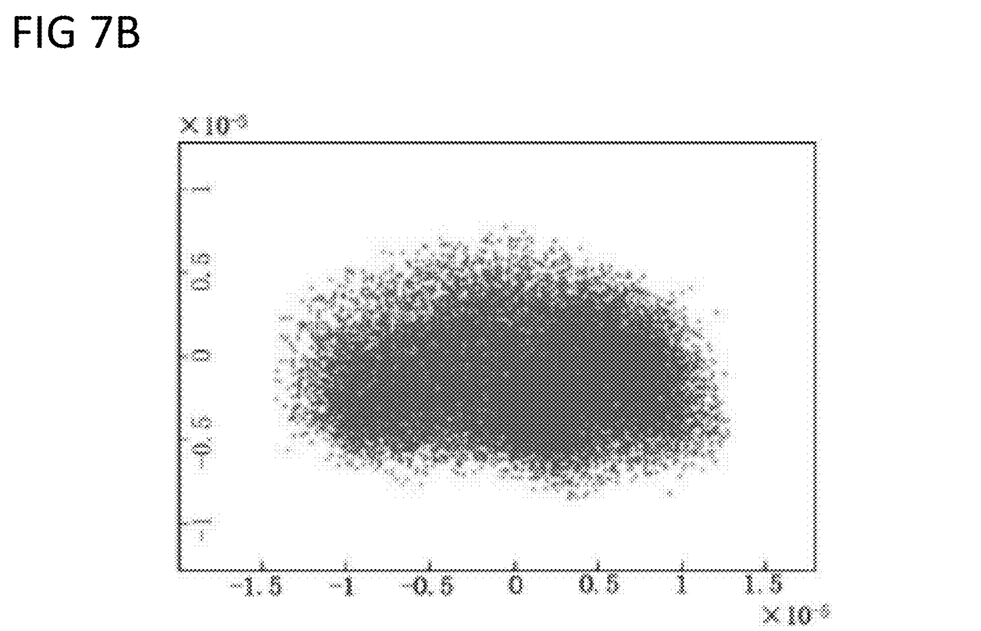

Referring to FIG. 7A and FIG. 7B, FIG. 7A schematically shows a target motion complex signal, and FIG. 7B schematically shows a target motion complex signal with the maximum variance direction rotated to the signal real axis. The real part of the rotated signal shown in FIG. 7B is taken, so that a target motion real signal can be acquired.

At least one target motion of the scanned object, such as a respiration or heartbeat motion, is a changing motion. In some embodiments, if the at least one target motion includes a first target motion and a second target motion, signs of the first target motion signal and the second target motion signal are acquired by using reference data, where for the first target motion signal, the reference data is data acquired after interference of the second target motion signal is removed from the data without external interference acquired in the first sub-period, the data without external interference is rotated to a maximum variance direction, and a real part is taken. For the second target motion signal, the reference data is data acquired after interference of the first target motion signal is removed from the data without external interference acquired in the first sub-period, the data without external interference is rotated to a maximum variance direction, and a real part is taken. For example, when the scanned object is a human body, the reference data of the respiration motion can be acquired by the following formula:

$$T1_r'=\text{real}(T1 \times v_r \times r_r) \quad (6)$$

$T1_r'$ is the reference data of the respiration motion, T1 is the data without external interference in the first specified sub-period, $v_r$ is a synthesis vector of the respiration signal, and $r_r$ is a rotation coefficient.

The reference data of the heartbeat motion can be acquired by the following formula:

$$T1_c'=\text{real}(T1 \times v_c \times r_c) \quad (7)$$

$T1_c'$ is the reference data of the heartbeat motion, T1 is the data without external interference in the first specified sub-period, $v_c$ is a synthesis vector of the heartbeat signal, and $r_c$ is a rotation coefficient.

In this case, signs of the respiration and heartbeat can be determined based on expected shapes of the respiration motion signal and the heartbeat motion signal. Both respiration and heartbeat signals show two offsets in opposite directions. For respiration, there are inhalation and exhalation. For heartbeat, there are systole and diastole. Since one signal offset is usually shorter in time than the other, the signal histogram is biased in the direction of one of the signal offsets. This property can be used to determine a sign of a signal such that one of the offsets is positive, typically, inspiration and diastole are positive.

In some examples, a direction of a signal is acquired by using distances between a maximum value and a minimum value of the signal and an average value of reference data, and if the difference between the maximum value of the signal and the average value of the reference data is greater than the difference between the average value of the reference data and the minimum value of the signal, the sign is 1. On the contrary, if the difference between the maximum value of the signal and the average value of the reference data is less than the difference between the average value of the reference data and the minimum value of the signal, the sign is −1.

For example, a respiration direction (inhalation/exhalation) can be calculated by using distances between a maximum value and a minimum value of the respiration signal and an average value of the respiration motion reference data $T1_r'$.

For the heartbeat signal, the average value is subtracted from the heartbeat motion reference data $T1_c'$ first, then a narrow front and rear bandpass is applied, and finally the sinking effect of a filter is removed by removing the beginning and end parts of a filter signal. Different order moments of the signal are evaluated, and preferably a sign of the third moment yields a heartbeat sign.

Alternatively, a positive or negative sign of the target motion can also be acquired based on the geometry of the device, such as relative positions of a pilot tone generator, a heart position, and a receiver coil.

After the sign of at least one target motion is acquired, at least one target motion synthesis total vector can be calculated based on the target motion synthesis vector, the rotation coefficient, and the motion sign.

For the respiration motion:

$$m_r=v_r \times r_r \times s_r \quad (8)$$

$v_r$ is the respiration signal synthesis vector; $r_r$ is the rotation coefficient of the respiration signal; $s_r$ is the sign of the respiration motion, that is, +1 or −1; and $m_r$ is the respiration signal synthesis total vector.

For the heartbeat motion:

$$m_c=v_c \times r_c \times s_c \quad (9)$$

$v_c$ is the heartbeat signal synthesis vector; $r_c$ is the rotation coefficient of the heartbeat signal; $s_c$ is the sign of the heartbeat motion, that is, +1 or −1; and $m_c$ is the heartbeat signal synthesis total vector.

After the multi-channel complex signal is multiplied by at least one target motion synthetic total vector and the real part is taken, a single-channel real signal of the at least one target motion can be acquired, and the sign of the at least one target motion can be represented.

For the respiration motion:

$$p_r(t)=\text{real}(d(t) \times m_r) \quad (10)$$

$p_r(t)$ is the synthesized respiration signal.

For the heartbeat motion:

$$p_c(t)=\text{real}(d(t) \times m_c) \quad (11)$$

$p_c(t)$ is the synthesized heartbeat signal.

In some embodiments, the method 100 further includes: removing peaks from the multi-channel complex signals by using a peak removal function. The peaks are removed, for example, to eliminate short-term signal offsets caused by detuned tuning transitions in the receiver coil. This offset is largely independent of the applied radio frequency power. Therefore, the peak removal function can be acquired in the following manner: transmitting calibration data, where the calibration data is a series (for example, 10) of individual weak radio frequencies played at large pulse intervals (for example, 200 ms); and averaging the signal after detuned tuning conversion to suppress other signals in the signal and subtracting the average signal value before the radio frequency pulse, to acquire the peak removal function f(TaRF), where TaRF stands for "time after retune event", and the peak removal function f(TaRF) is a matrix and includes a complex vector of each receiving channel. The peak removal function is stored and used by a real-time processing module when needed.

In response to that the real-time processing module receives information about a radio frequency pulse to be executed, for a currently processed sample, the most recently executed radio frequency pulse is determined by comparing timestamps, and TaRF is determined according to a timestamp difference between a retune event of the radio frequency pulse and a timestamp of the currently processed sample. f(TaRF) is subtracted from the current sample in response to requesting peak removal.

In an embodiment of the disclosure, to improve external interference (such as radio frequency interference) suppression, in addition to applying the external interference suppression matrix, before the multi-channel complex signal is multiplied with at least one target motion signal synthesis vector, peak removal processing may be performed on the multi-channel complex signal.

Figure 8:
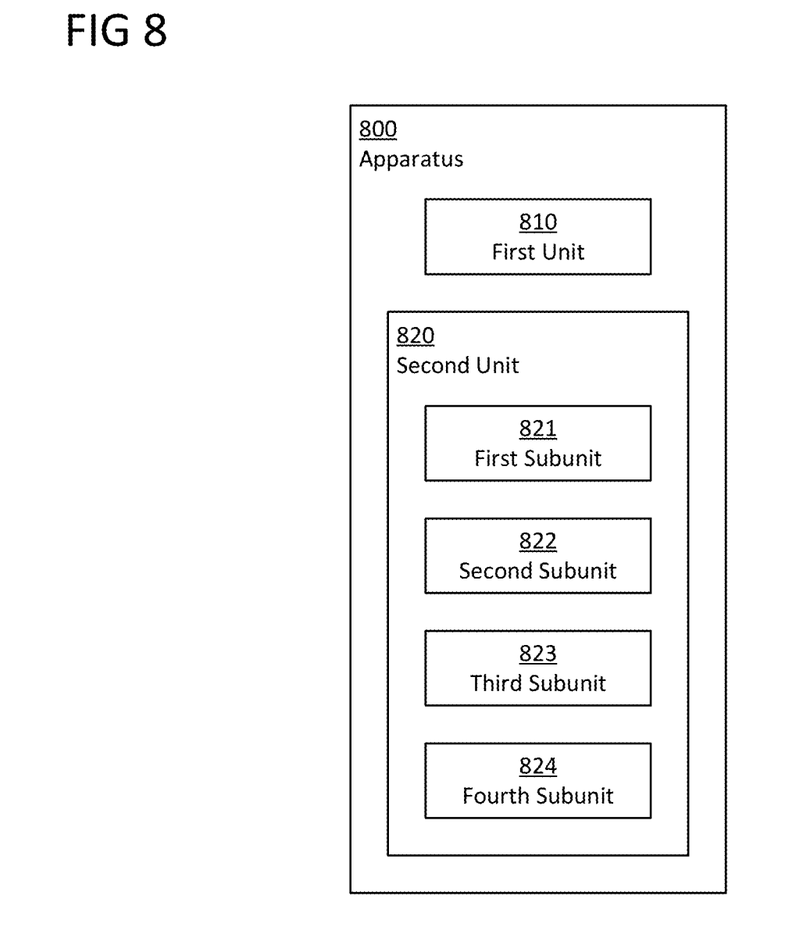
FIG. 8 is a block diagram of an apparatus for acquiring at least one target motion signal according to some embodiments of the disclosure.

According to another aspect of the disclosure, an apparatus 800 for acquiring a target physiological motion signal is proposed, and the apparatus 800 includes: a first unit 810, configured to acquire multi-channel complex signals received by multiple channels, where each of the multi-channel complex signals is a signal received after a high-frequency signal is modulated by at least one target motion signal of a scanned object in magnetic resonance scanning; and a second unit 820, configured to acquire, from the multi-channel complex signals by using a motion signal synthesis vector corresponding to at least one target motion signal, at least one target motion complex signal with interference removed. The second unit 820 includes: a first subunit 821, configured to acquire data received by multiple channels within a specified period, where the data received by the multiple channels within the specified period includes data without external interference in a first specified sub-period and data with external interference in a second specified sub-period; a second subunit 822, configured to acquire an external interference suppression matrix based on the data without external interference in the first specified sub-period and the data with external interference in the second specified sub-period, and acquire external interference suppression data based on the data without external interference or the data with external interference and the external interference suppression matrix; a third subunit 823, configured to acquire a motion signal correlation matrix of the at least one target motion signal in frequency domain based on the external interference suppression data and a frequency of the at least one target motion signal; and a fourth subunit 824, configured to use, as the motion signal synthesis vector, an eigenvector acquired according to an eigenvalue of the motion signal correlation matrix.

According to another aspect of the disclosure, an electronic device is provided, including at least one processor and a memory communicatively connected to the at least one processor, where the memory stores a computer program, and when executed by the at least one processor, the computer program realizes the method according to any one of the above-mentioned embodiments.

According to another aspect of the disclosure, a pilot tone device is proposed, including: a transmitter, configured to transmit a high-frequency signal, where the high-frequency signal is a radio frequency signal outside a band of a magnetic resonance radio frequency signal; a multi-channel receiver, configured to receive a high-frequency signal modulated by a first physiological motion signal and a second physiological motion signal of a scanned object in magnetic resonance scanning; and the above-mentioned electronic device.

According to another aspect of the disclosure, a magnetic resonance device is provided, including the pilot tone device of any one of the above-mentioned embodiments. The pilot device has a transmitting antenna, and the transmitting antenna can be integrated into a local coil placed on a scanned object. The operation of the local coil, such as fastening and positioning, can be performed like a normal coil without additional operations, which is simple and easy for an operator. In addition, no burden is increased for a scanned object due to a sensor disposed inside or on the skin.

According to another aspect of the embodiment of the disclosure, a non-transitory computer-readable storage medium storing a computer program is proposed, where when executed by a processor, the computer program realizes the method according to any one of the above-mentioned embodiments.

According to another aspect of the embodiment of the disclosure, a computer program product is provided, including a computer program, where when executed by a processor, the computer program realizes the method according to any one of the above-mentioned embodiments.

The electronic device is intended to mean various forms of digital electronic computing devices, such as laptop computers, desktop computers, workstations, personal digital assistants, servers, blade servers, mainframes, and other suitable computers. The electronic device may also represent various forms of mobile apparatuses, such as personal digital assistants, cellular phones, smartphones, wearable devices, and other similar computing apparatuses. The components shown herein, their connections and relationships, and their functions, are by way of example only, and are not intended to limit implementations of the disclosure described and/or claimed herein.

Various implementations of the systems and technologies described herein above may be implemented in a digital electronic circuit system, an integrated circuit system, a field programmable gate array (FPGA), an application-specific integrated circuit (ASIC), an application-specific standard product (ASSP), a system-on-chip (SOC) system, a complex programmable logical device (CPLD), computer hardware, firmware, software, and/or a combination thereof. These various implementations may include: The systems and technologies are implemented in one or more computer programs, where the one or more computer programs may be executed and/or interpreted on a programmable system including at least one programmable processor. The programmable processor may be a dedicated or general-purpose programmable processor that may receive data and instructions from a storage system, at least one input apparatus, and at least one output apparatus, and transmit data and instructions to the storage system, the at least one input apparatus, and the at least one output apparatus.

Program codes used to implement the method of the disclosure may be written in any combination of one or more programming languages. These program codes may be provided for a processor or a controller of a general-purpose computer, a special-purpose computer, or other programmable data processing apparatuses, such that when the program codes are executed by the processor or the controller, the functions/operations specified in the flowcharts and/or block diagrams are implemented. The program code may run entirely on the machine, partly on the machine, or run partly on the machine and partly on a remote machine or entirely on a remote machine or a server as a stand-alone software package.

In the context of the disclosure, a machine-readable medium may be a tangible medium that may contain or store a program for use by or in conjunction with an instruction execution system, apparatus, or device. A machine-readable medium may be a machine-readable signal medium or a machine-readable storage medium. A machine-readable medium may include, but is not limited to, electronic, magnetic, optical, electromagnetic, infrared, or semiconductor systems, apparatus, or devices, or any suitable combination of the foregoing. More specific examples of a machine-readable storage medium may include an electrical connection based on one or more wires, a portable computer disk, a hard disk, a random-access memory (RAM), a read-only memory (ROM), an erasable programmable read-only memory (EPROM or flash memory), an optic fiber, a compact disk read-only memory (CD-ROM), an optical storage device, a magnetic storage device, or any suitable combination of the foregoing.

In order to provide interaction with a user, the systems and technologies described herein may be implemented on a computer which has: a display device (for example, a cathode ray tube (CRT) or liquid crystal display (LCD) monitor) for displaying information to a user; and a keyboard and a pointing apparatus (for example, a mouse or a trackball) through which the user may provide an input to the computer. Other categories of apparatuses can also be used to provide interaction with the user; for example, feedback provided to the user may be any form of sensory feedback (for example, visual feedback, auditory feedback, or tactile feedback), and an input from the user may be received in any form (including an acoustic input, a speech input, or a tactile input).

The systems and technologies described herein may be implemented in a computing system (for example, as a data server) including a backend component, or a computing system (for example, an application server) including a middleware component, or a computing system (for example, a user computer with a graphical user interface or a web browser through which the user may interact with the implementation of the systems and technologies described herein) including a frontend component, or a computing system including any combination of the backend component, the middleware component, or the frontend component. The components of the system may be connected to each other through digital data communication (for example, a communications network) in any form or medium. Examples of communication networks include: a local area network (LAN), a wide area network (WAN), and the Internet.

It should be understood that steps may be reordered, added, or deleted using the various forms of flows shown above. For example, the steps recorded in the disclosure may be performed in parallel, in order, or in a different order, provided that the desired result of the technical solutions disclosed in the disclosure may be achieved, which is not limited herein.

Although the embodiments or examples of the disclosure have been described with reference to the drawings, it should be appreciated that the methods, systems, and devices described above are merely exemplary embodiments or examples, and the scope of the present invention is not limited by the embodiments or examples, but only defined by the appended authorized claims and equivalent scopes thereof. Various elements in the embodiments or examples may be omitted or substituted by equivalent elements thereof. Moreover, the steps may be performed in an order different from that described in the disclosure. Further, various elements in the embodiments or examples may be combined in various ways. It is important that, as the technology evolves, many elements described herein may be replaced with equivalent elements that appear after the disclosure.

The above description is only embodiments of the present invention and is not intended to limit the present invention, and any modifications, equivalent replacements, improvements, etc. made within the spirit and principles of the present invention should be included within the scope of protection of the present invention.

The invention claimed is:

1. A method for acquiring at least one target motion signal in a magnetic resonance imaging system, comprising:
   acquiring, by a multi-channel receiver comprising multiple local coils with integrated pilot tone devices, multi-channel complex signals, wherein each of the multi-channel complex signals is a signal received after a high-frequency signal transmitted by a pilot tone transmitter is modulated by at least one target motion signal of a scanned object in magnetic resonance scanning;
   acquiring, by at least one processor operatively coupled to the multi-channel receiver, from the multi-channel complex signals by using a motion signal synthesis vector corresponding to at least one target motion signal, at least one target motion complex signal with interference removed, wherein the motion signal synthesis vector corresponding to the at least one target motion signal is acquired by:
      acquiring, during a specified period of the magnetic resonance scanning, data received by the multiple local coils, wherein the data comprises data without radio frequency interference in a first specified sub-period before a radio frequency pulse sequence runs and data with radio frequency interference in a second specified sub-period when the radio frequency pulse sequence runs;
      acquiring a radio frequency interference suppression matrix based on the data without radio frequency interference and the data with radio frequency interference, and acquiring radio frequency interference suppression data based on the data without radio frequency interference or the data with radio frequency interference and the radio frequency interference suppression matrix;
      acquiring a motion signal correlation matrix of the at least one target motion signal in frequency domain based on the radio frequency interference suppression data and a frequency range of the at least one target motion signal; and
      using, as the motion signal synthesis vector, an eigenvector acquired according to an eigenvalue of the motion signal correlation matrix; and
   outputting the at least one target motion complex signal for use in magnetic resonance image acquisition timing or motion correction.

2. An apparatus for acquiring at least one target motion signal in a magnetic resonance imaging system, comprising:
   a multi-channel receiver comprising multiple local coils with integrated pilot tone devices;
   a pilot tone transmitter configured to transmit a high-frequency signal;
   a first processing unit, configured to acquire multi-channel complex signals received by multiple channels, wherein each of the multi-channel complex signals is a signal received after a high-frequency signal is modulated by at least one target motion signal of a scanned object in magnetic resonance scanning; and
   a second processing unit, configured to acquire, from the multi-channel complex signals by using a motion signal synthesis vector corresponding to at least one target motion signal, at least one target motion complex signal with interference removed, wherein the second processing unit comprises:
      a first processing subunit, configured to acquire data received by multiple channels within a specified period, wherein the data received by the multiple channels within the specified period comprises data without radio frequency interference in a first specified sub-period before a radio frequency pulse sequence runs and data with radio frequency interference in a second specified sub-period when the radio frequency pulse sequence runs;
      a second processing subunit, configured to acquire a radio frequency interference suppression matrix based on the data without radio frequency interference in the first specified sub-period of the specified period and the data with radio frequency interference in the second specified sub-period, and acquire radio frequency interference suppression data based on the data without radio frequency interference or the data with radio frequency interference and the radio frequency interference suppression matrix;

a third processing subunit, configured to acquire a motion signal correlation matrix of the at least one target motion signal in frequency domain based on the radio frequency interference suppression data and a frequency of the at least one target motion signal; and a fourth processing subunit, configured to use, as the motion signal synthesis vector, an eigenvector acquired according to an eigenvalue of the motion signal correlation matrix, wherein the second processing unit is further configured to output the at least one target motion complex signal for use in magnetic resonance image acquisition timing or motion correction.

3. A pilot tone device, integrated into a local coil of a magnetic resonance imaging system, comprising:

a transmitter, configured to transmit a high-frequency signal, wherein the high-frequency signal is a radio frequency signal outside a band of a magnetic resonance radio frequency signal;

a multi-channel receiver comprising multiple local coils with integrated pilot tone devices, configured to receive a high-frequency signal modulated by a first target motion signal and a second target motion signal of a scanned object in magnetic resonance scanning; and an electronic device, comprising:

at least one processor; and a memory communicatively coupled to the at least one processor, wherein the memory stores a computer program, and when executed by the at least one processor, the computer program implements a method for acquiring at least one target motion signal in a magnetic resonance imaging system, comprising:

acquiring, by a multi-channel receiver comprising multiple local coils with integrated pilot tone devices, multi-channel complex signals, wherein each of the multi-channel complex signals is a signal received after a high-frequency signal transmitted by a pilot tone transmitter is modulated by at least one target motion signal of a scanned object in magnetic resonance scanning;

acquiring, by at least one processor operatively coupled to the multi-channel receiver, from the multi-channel complex signals by using a motion signal synthesis vector corresponding to at least one target motion signal, at least one target motion complex signal with interference removed, wherein the motion signal synthesis vector corresponding to the at least one target motion signal is acquired by:

acquiring, during a specified period of the magnetic resonance scanning, data received by the multiple local coils, wherein the data comprises data without radio frequency interference in a first specified sub-period before a radio frequency pulse sequence runs and data with radio frequency interference in a second specified sub-period when the radio frequency pulse sequence runs;

acquiring a radio frequency interference suppression matrix based on the data without radio frequency interference and the data with radio frequency interference, and acquiring radio frequency interference suppression data based on the data without radio frequency interference or the data with radio frequency interference and the radio frequency interference suppression matrix;

acquiring a motion signal correlation matrix of the at least one target motion signal in frequency domain based on the radio frequency interference suppression data and a frequency range of the at least one target motion signal;

using, as the motion signal synthesis vector, an eigenvector acquired according to an eigenvalue of the motion signal correlation matrix; and outputting the at least one target motion complex signal for use in magnetic resonance image acquisition timing or motion correction.

4. The method as claimed in claim 1, wherein the eigenvector acquired according to the eigenvalue is a maximum eigenvector corresponding to a maximum eigenvalue of the motion signal correlation matrix used as the motion signal synthesis vector by the at least one processor.

5. The method as claimed in claim 1, further comprising:
rotating, by the at least one processor, a maximum variance direction of the at least one target motion complex signal to a signal real axis and taking a real part of the signal.

6. The method as claimed in claim 1, wherein the radio frequency interference suppression matrix is acquired by the at least one processor by:

estimating data without radio frequency interference in the second specified sub-period by using the data without radio frequency interference in the first specified sub-period, and using an increment of the data with radio frequency interference in the second specified sub-period relative to the estimated data without radio frequency interference in the second specified sub-period as correction data, wherein the correction data constitutes a correction matrix; and decomposing the correction matrix into eigenvalues and eigenvectors, and removing an eigenvector whose energy accounts for more than a specified threshold in total energy of all eigenvectors, or removing an eigenvector with the largest energy, to generate the radio frequency interference suppression matrix.

7. The method as claimed in claim 1, wherein the acquiring a motion signal correlation matrix of the at least one target motion signal in frequency domain comprises:

acquiring, by the at least one processor, a frequency correlation matrix of the at least one target motion signal based on the frequency range of the at least one target motion signal and a number of data samples within the specified period; and calculating at least one target motion signal correlation matrix based on the frequency correlation matrix of the at least one target motion signal and the radio frequency interference suppression data in at least one specified period.

8. The method as claimed in claim 1, wherein the at least one target motion signal comprises a first target motion signal and a second target motion signal, and the method further comprises:

acquiring, by the at least one processor, signs of the first target motion signal and the second target motion signal by using reference data, wherein for the first target motion signal, the reference data is data acquired after interference of the second target motion signal is removed from the data without radio frequency interference acquired in the first specified sub-period, the data without radio frequency interference is rotated to a maximum variance direction, and a real part is taken; and for the second target motion signal, the reference data is data acquired after interference of the first target motion signal is removed from the data without radio frequency interference acquired in the first sub-period, the data without radio frequency interference is rotated to a maximum variance direction, and a real part is taken.

9. The method as claimed in claim 1, further comprising:
performing, by the at least one processor, peak removal processing on the multi-channel complex signals by using a peak removal function.

10. A non-transitory computer-readable storage medium storing a computer program, wherein when executed by a processor operatively coupled to a multi-channel receiver comprising multiple local coils with integrated pilot tone devices, the computer program implements the method as claimed in claim 1.

11. The method as claimed in claim 6, further comprising:
acquiring, by the at least one processor, data received by multiple channels within multiple specified periods, wherein data within each specified period comprises data without radio frequency interference in a first specified sub-period and data with radio frequency interference in a second specified sub-period;
acquiring correction data within each specified period; and
calculating an average of multiple pieces of correction data to acquire average correction data, wherein the average correction data constitutes the correction matrix.

12. The method as claimed in claim 7, wherein the at least one target motion signal comprises a first target motion signal and a second target motion signal, the first target motion signal being one of a heartbeat signal and a respiration signal, and the second target motion signal being the other of the heartbeat signal and the respiration signal, wherein the method further comprises:
acquiring, by the at least one processor, a correlation matrix of the first target motion signal;
decomposing the correlation matrix of the first target motion signal into eigenvalues and eigenvectors, and removing an eigenvector whose energy accounts for more than a specified threshold in total energy of all eigenvectors, or removing an eigenvector with the largest energy, to generate a first target motion suppression matrix;
acquiring radio frequency interference and first object motion interference suppression data based on the radio frequency interference suppression data and the first target motion suppression matrix; and
acquiring a second target motion correlation matrix based on the frequency correlation matrix of the second target motion signal and the radio frequency interference and first object motion interference suppression data.

\* \* \* \* \*